United States Patent
Yeh et al.

(10) Patent No.: US 12,400,692 B2
(45) Date of Patent: Aug. 26, 2025

(54) MEMORY DEVICE AND MANUFACTURING METHOD AND TEST METHOD OF THE SAME

(71) Applicant: TAIWAN SEMICONDUCTOR MANUFACTURING COMPANY, LTD., Hsinchu (TW)

(72) Inventors: Min-Chiao Yeh, Taoyuan (TW); Chieh Lee, Hsinchu (TW); Chia-En Huang, Hsinchu County (TW); Ji Kuan Lee, Taichung (TW); Yao-Jen Yang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 250 days.

(21) Appl. No.: 17/896,506

(22) Filed: Aug. 26, 2022

(65) Prior Publication Data
US 2024/0071442 A1   Feb. 29, 2024

(51) Int. Cl.
*G11C 7/12*     (2006.01)
*G11C 13/00*    (2006.01)

(52) U.S. Cl.
CPC ............ *G11C 7/12* (2013.01); *G11C 13/0026* (2013.01); *G11C 13/0028* (2013.01)

(58) Field of Classification Search
CPC ... G11C 7/12; G11C 13/0026; G11C 13/0028; G11C 29/025; G11C 29/50; G11C 2029/1204; G11C 11/221; G11C 11/2257; G11C 11/2255; G11C 11/4085; G11C 11/4094
See application file for complete search history.

(56) References Cited

U.S. PATENT DOCUMENTS

| | | | |
|---|---|---|---|
| 7,902,869 B1 * | 3/2011 | Carter | H01L 27/0688 326/39 |
| 7,920,408 B2 * | 4/2011 | Azuma | G11C 13/003 365/46 |
| 8,391,079 B2 * | 3/2013 | La Rosa | G11C 16/16 365/185.12 |
| 10,930,350 B2 * | 2/2021 | You | G11C 7/20 |
| 2001/0010640 A1 * | 8/2001 | Sato | G11C 8/08 365/63 |
| 2010/0046273 A1 * | 2/2010 | Azuma | G11C 13/0023 257/E47.001 |
| 2012/0063194 A1 * | 3/2012 | Baek | H10B 63/20 257/E45.002 |

(Continued)

*Primary Examiner* — Khamdan N. Alrobaie
(74) *Attorney, Agent, or Firm* — Birch, Stewart, Kolasch & Birch, LLP

(57) ABSTRACT

A method is provided, including following operations: activating a first word line to couple a first bit line with a second bit line to form a first conductive loop through a first transistor having a first terminal coupled to the first bit line and a second transistor having a first terminal coupled to the second bit line, wherein second terminals of the first and second transistors are coupled together; activating a second word line to couple a third bit line with a fourth bit line to form a second conductive loop, wherein the first and second word lines are disposed below the first to fourth bit lines; and identifying that the first conductive loop, the second conductive loop, or the combinations thereof is short-circuited or open-circuited.

20 Claims, 16 Drawing Sheets

(56) References Cited

U.S. PATENT DOCUMENTS

| | | | |
|---|---|---|---|
| 2014/0078826 A1* | 3/2014 | Sel | H10B 41/10 |
| | | | 257/E21.645 |
| 2015/0003157 A1* | 1/2015 | Aritome | G11C 16/3427 |
| | | | 365/185.11 |
| 2015/0003158 A1* | 1/2015 | Aritome | G11C 16/10 |
| | | | 365/185.11 |
| 2018/0040377 A1* | 2/2018 | Sakui | G11C 8/08 |
| 2020/0341691 A1* | 10/2020 | Hsu | G06F 9/30185 |

* cited by examiner

MEMORY DEVICE AND MANUFACTURING METHOD AND TEST METHOD OF THE SAME

BACKGROUND

As integrated circuits have become complex in structure, so does the time required to properly test these devices. Considering the three-dimensional design having the high volume production of some semiconductor devices, such an increase in testing time and the corresponding testing cost can significantly increase the cost of the final product. During the bit line testing process of a memory device, high failure rate at specific die locations or low overall yield rate are often indications that there might be a defect in the wafer fabrication process. Multiple test methods implemented at once are required to improve the test efficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
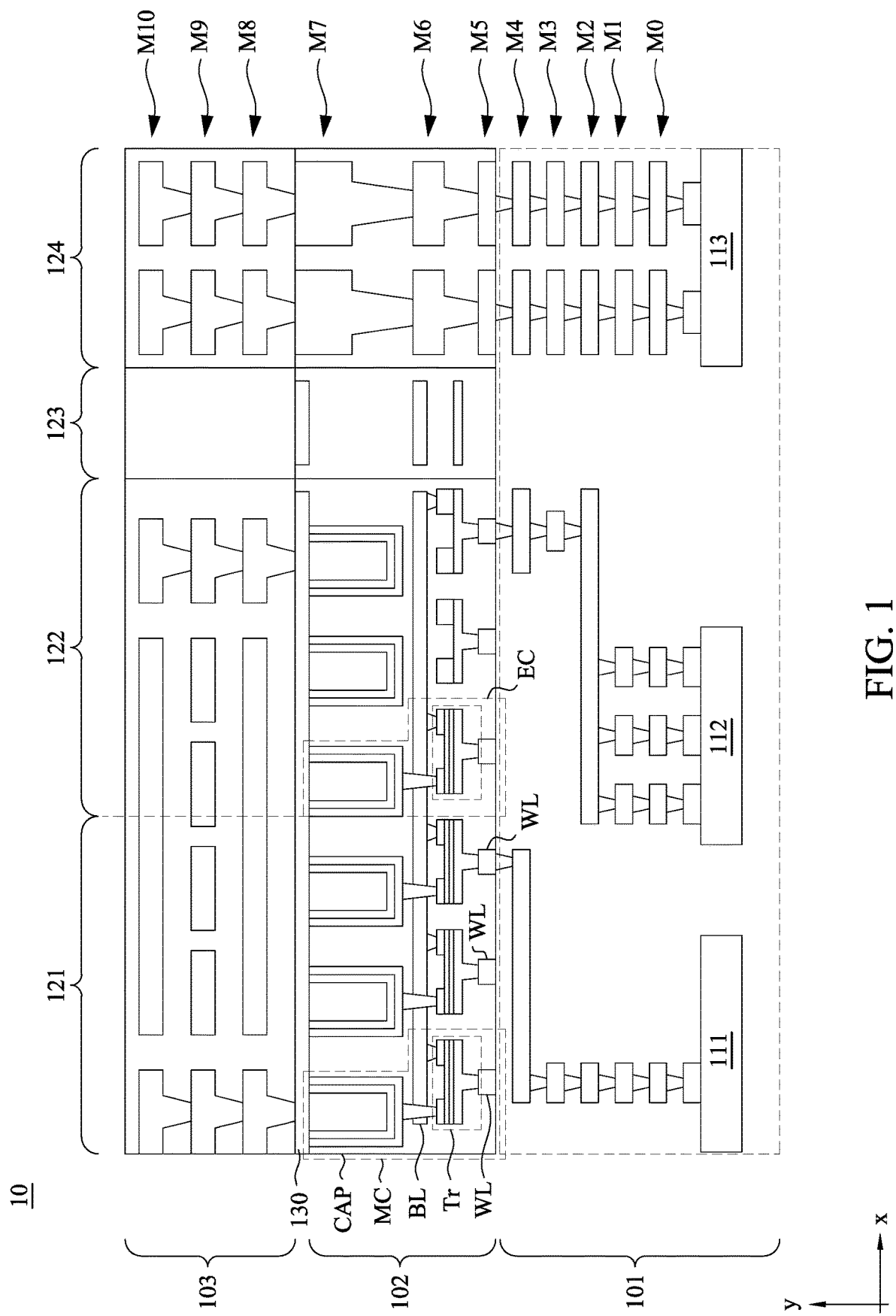
FIG. 1 is a cross-sectional diagram of part of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a cross-sectional diagram of part of a memory device 10, in accordance with some embodiments. For illustration, the memory device 10 includes sections 101-103 in which the sections 102-103 are arranged above the section 101 and the section 102 is interposed between the sections 101 and 103. Alternatively stated, the sections 101-103 are stacked along z direction.

For illustration, the section 101 includes a word line driver region 111, a sense amplifier region 112, a region 113 including other logic circuits for cooperation in the memory device 10, metal gates MG and stacked connection layers (e.g., metal-zero layers to metal-four layers) M0-M4 coupled between elements in the sections 101-102. In some embodiments, the word line driver region 111 includes word line drivers each configured to activate a corresponding word line WL to access memory cells MC in the memory array 121. The sense amplifier region 112 includes sense amplifiers configured to read out stored data transmitted in (a) bit line(s) BL from the memory array 121. In some embodiments, the logic circuits in the region 113 includes a control circuit, an input/output circuit, decoders, and other circuits for read and write operation performed in the memory device 10.

The section 102 includes the memory array 121 having multiple memory cells MC each coupled the bit line BL and coupled to a corresponding word line driver in the word line driver region 111 through a corresponding word line (e.g., one of the word line WL). In some embodiments, the word lines WL are conductive lines disposed in a connection layer (e.g., metal-five layer) M5. The bit line BL is a conductive line disposed in a connection layer (e.g., metal-six layer) M6 above the connection layers M0-M5. For illustration, each of the memory cells MC includes a transistor Tr and a capacitor CAP that is coupled to a conductive layer 130. The conductive layer 130 is coupled to a ground having a ground potential (e.g., 0 Volt) and referred to as a top electrode of the capacitors CAP. In some embodiments, the conductive layer 130 is arranged in a connection layer (e.g., metal-seven layer) M7. The transistor Tr is coupled to the bit line BL and the word line WL. For the sake of brevity, only one word line WL is illustrated to couple the word line driver region 111.

In some embodiments, an edge region 122 in the section 102 is separated from the memory array 121 along x direction and includes edge cells EC, having the same configurations as the memory cell MC, and bit line jogs coupled between the bit line BL and the sense amplifier region 112. For illustration, the edge region 122 is further apart from a logic region 124 (e.g., including the region 113) by a transition region 123.

In some embodiments, the section 103 includes stacked connection layers (e.g., metal-eight layers to metal-ten layers) M8-M10 coupled to elements in the sections 101-102 for signal routing in the memory device 10.

In general, the section 102 is manufactured in a back end of line (BEOL) process, which includes contacts, dielectric layers, conductive layers, and bonding sites for chip-to-package connections, according to some embodiments. The section 103 is manufactured in a front end of line (FEOL), which is the second portion of IC fabrication where the individual devices are interconnected with wiring or conductive layers.

The configurations of FIG. 1 are given for illustrative purposes. Various implements are within the contemplated scope of the present disclosure. For example, in some embodiments, more or less connection layers are in the sections 101-103.

Figure 2B:
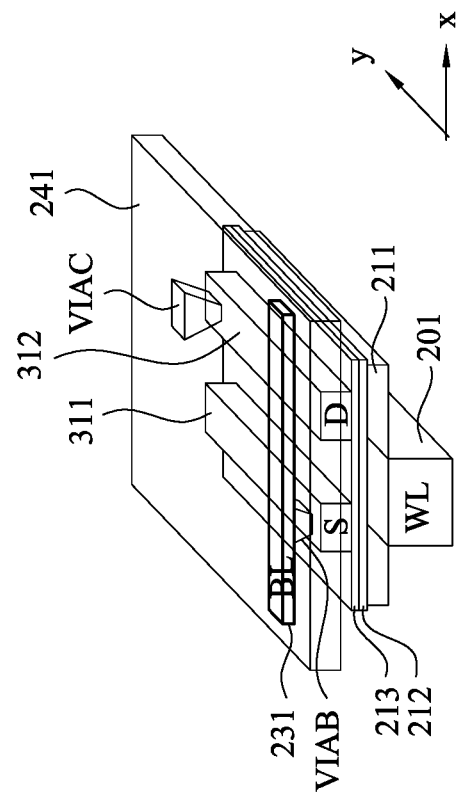
FIG. 2B is a three-dimensional (3D) schematic diagram of a memory cell corresponding to FIG. 2A, in accordance with some embodiments.
Figure 2A:
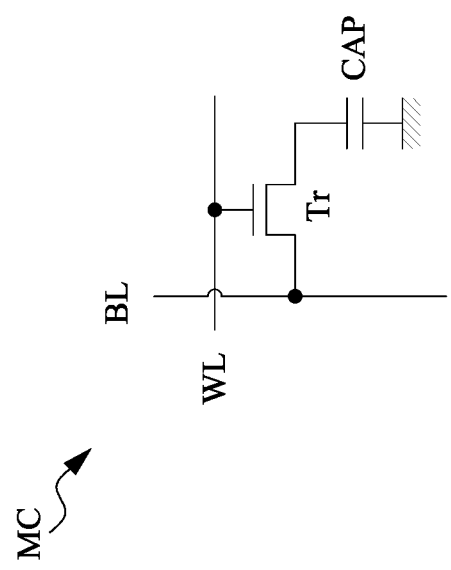
FIG. 2A is a schematic diagram of a memory cell, in accordance with some embodiments.

Reference is now made to FIGS. 2A-2B. FIG. 2A is a schematic diagram of the memory cell MC, and FIG. 2B is a three-dimensional (3D) schematic diagram of a memory cell corresponding to FIG. 2A, in accordance with some embodiments. In some embodiments, the memory cell MC includes a dynamic random access memory (DRAM). For illustration, the transistor Tr in the memory cell MC has a control terminal coupled to the word line WL, a drain/source terminal coupled to the bit line BL, and a source/drain terminal coupled to the capacitor CAP. In some embodiments, the memory cell MC is configured to store a bit data, for example, "1" or "0".

As illustratively shown in FIG. 2B, the memory cell MC includes a word line 201, a bottom gate structure 211, a gate oxide structure 212, a transistor channel structure 213, and conductive segments (e.g., metal-on-device, MD) 311-312. In some embodiments, the word line 201 corresponds to the word line WL in FIGS. 1 and 2A and is disposed in the connection layer M5, and the bottom gate structure 211 corresponds to the control (gate) terminal of the transistor Tr and is coupled to the word line 201. The conductive segment 311 corresponds to the source terminal of the transistor Tr and is referred to as a source structure (e.g., marked as "S"). The conductive segment 312 corresponds to the drain terminal of the transistor Tr and is referred to as a drain structure (e.g., marked as "D"). The configurations of FIGS. 2A-2B are given for illustrative purposes. Various implements are within the contemplated scope of the present disclosure. For example, in some embodiments, the conductive segments 311-312 correspond to the drain and source terminals of the transistor Tr respectively.

For illustration, the bottom gate structure 211 is disposed below the gate oxide structure 212 which is under the transistor channel structure 213. In some embodiments, the bottom gate structure 211 includes, for example, a conductive material selected from a group comprising of polycrystalline-silicon (poly-Si), poly-crystalline silicon-germanium (poly-SiGe), metal materials, and the like. For example, metal materials may include tantalum, titanium, molybdenum, tungsten, copper, a combination thereof and the like. The gate oxide structure 212 include materials for isolation, for example, nitride, aluminum oxide, and any high-k with trap characteristics for charge-based memory applications as the memory cell MC, and Perovskite, strontium bismuth tantalite (SBT), lead zirconium titanate (PZT), hafnium zirconium oxide (HfZrOx), hafnium oxide (HfO) and any ferroelectric characteristics for ferroelectric-based memory applications as the memory cell MC. The transistor channel structures 213 include for example, a conductive material of polycrystalline-silicon (poly-Si), low-temperature polycrystalline silicon (LTPS), amorphous silicon, indium gallium zinc oxide (IGZO) and any semi-conductor characteristic material.

As shown in FIG. 2B, the word line 201 and the conductive segments 311-312 extend in y direction and the bit line 231 extends in x direction. The conductive segments 311-312 are further separated from each other in x direction. In the embodiments of FIG. 2B, the conductive segment 311 is coupled to a bit line 231, corresponding to the bit line BL of FIGS. 1 and 2A, through a via VIAB. The conductive segment 312 is coupled to a capacitor structure 241, corresponding to the capacitor CAP of FIGS. 1 and 2A, through a via VIAC.

With reference to FIGS. 1-2B together, when the word line 201 receives a word line voltage and is activated correspondingly, the transistor Tr is turned on. Due to the word line voltage applied on the bottom gate structure 211, the conductive segments 311-312 are electrically connected through a conducted channel established in the transistor channel structure 213 therebetween. Accordingly, a (current) signal is transmitted between the conductive segments 311-312.

Figure 3:
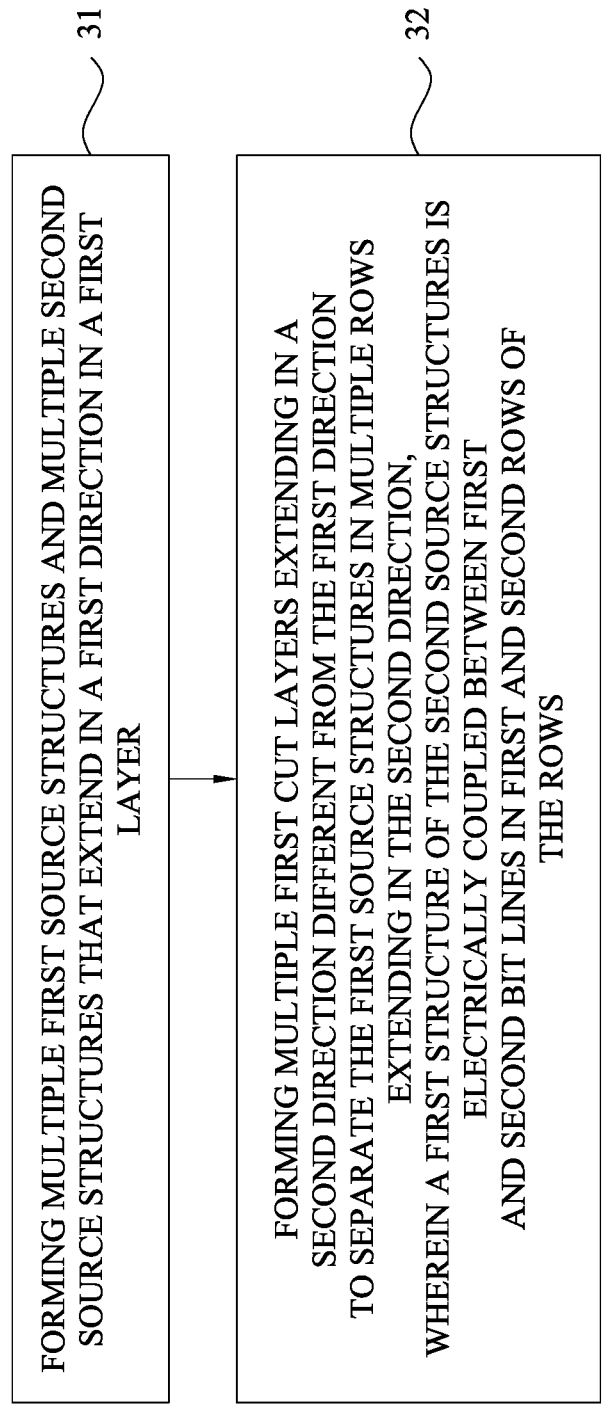
FIG. 3 is a flow chart of a method of manufacturing a memory device, in accordance with some embodiments.
Figure 4A:
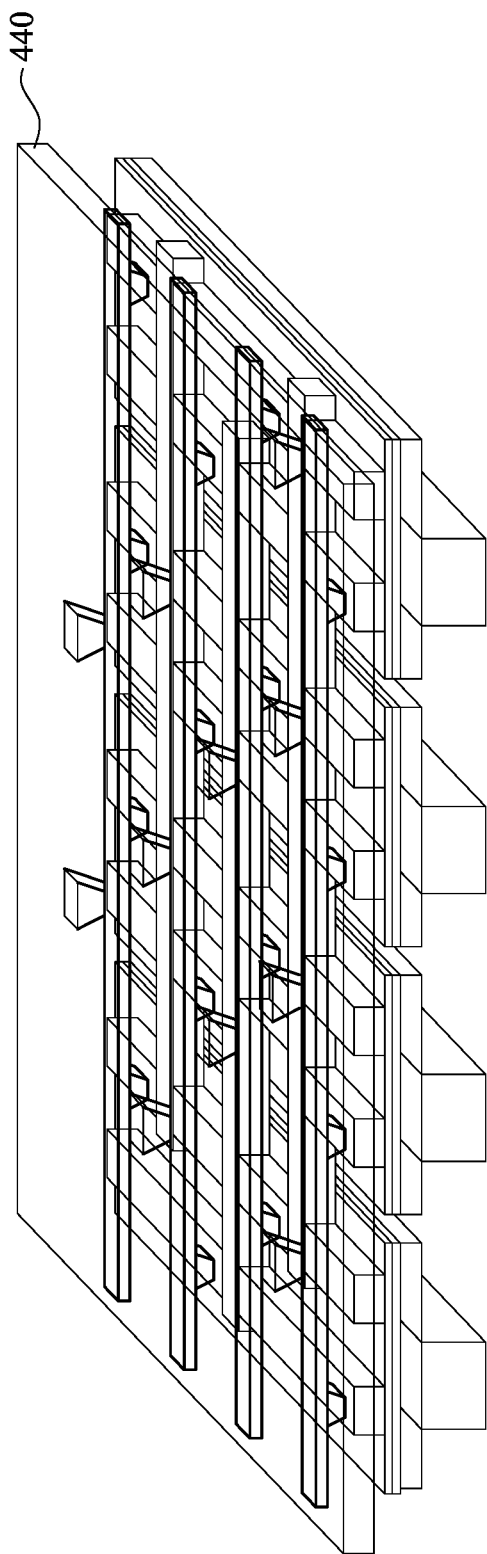
FIGS. 4A-4B are 3D schematic diagrams of part of a memory device corresponding to FIGS. 1 and 2A-2B, in accordance with some embodiments.

Reference is now made to FIG. 3. FIG. 3 is a flow chart of a method 30 of manufacturing a memory device, in accordance with some embodiments. It is understood that additional operations can be provided before, during, and after the processes shown by FIG. 3, and some of the operations described below can be replaced or eliminated, for additional embodiments of the method. The order of the operations/processes may be interchangeable. Throughout the various views and illustrative embodiments, like reference numbers are used to designate like elements. The method 30 includes operations 31-32 that are described below with reference to the memory device in FIGS. 1-13. With respect to FIGS. 1-2B, like elements in FIGS. 4A-5 are designated with the same reference numbers for ease of understanding. The specific operations of similar elements, which are already discussed in detail in the above paragraphs, are omitted herein for the sake of brevity, unless there is a need to introduce the co-operation relationship with the elements shown in FIGS. 4A-5.

Figure 4B:
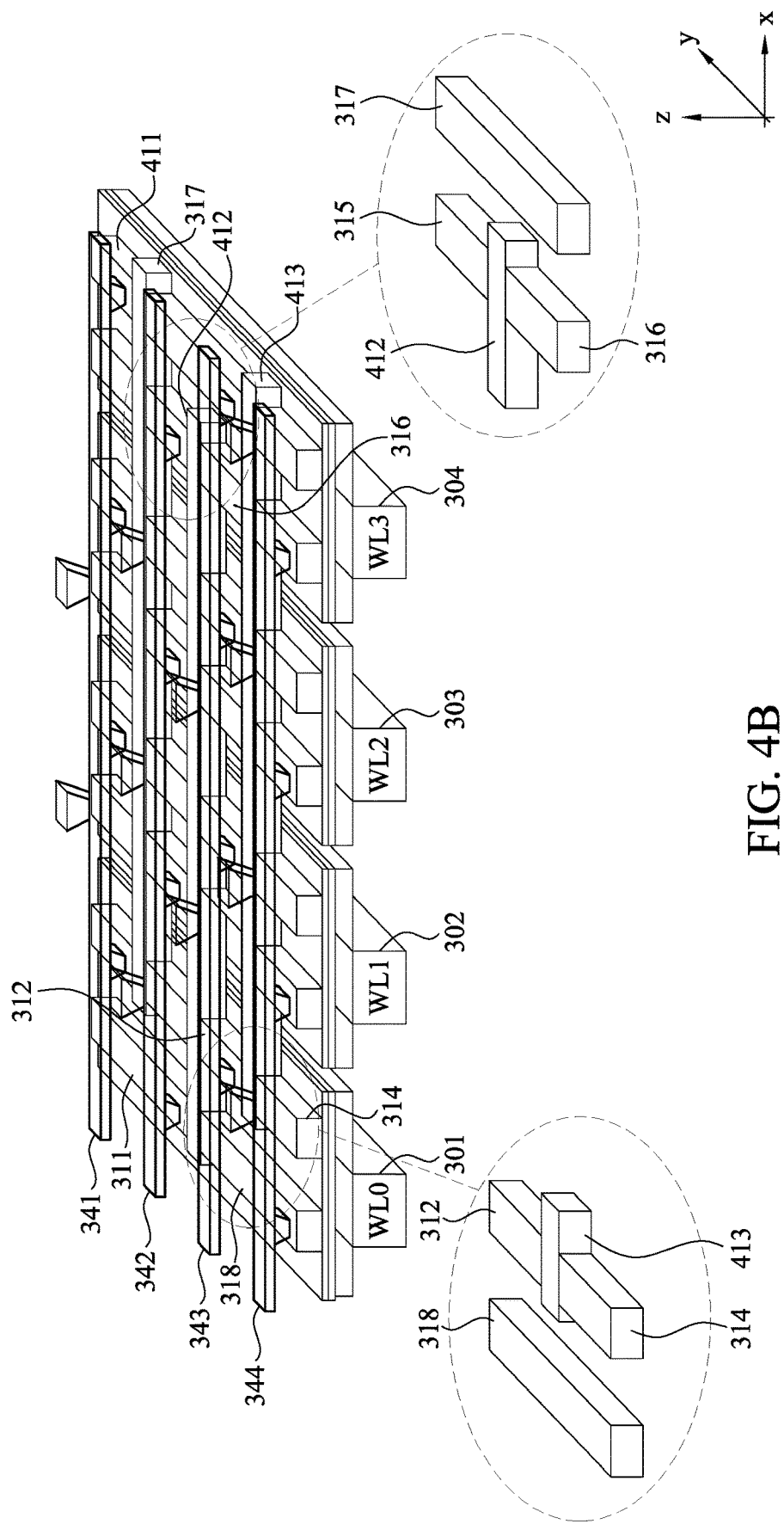
Figure 5:
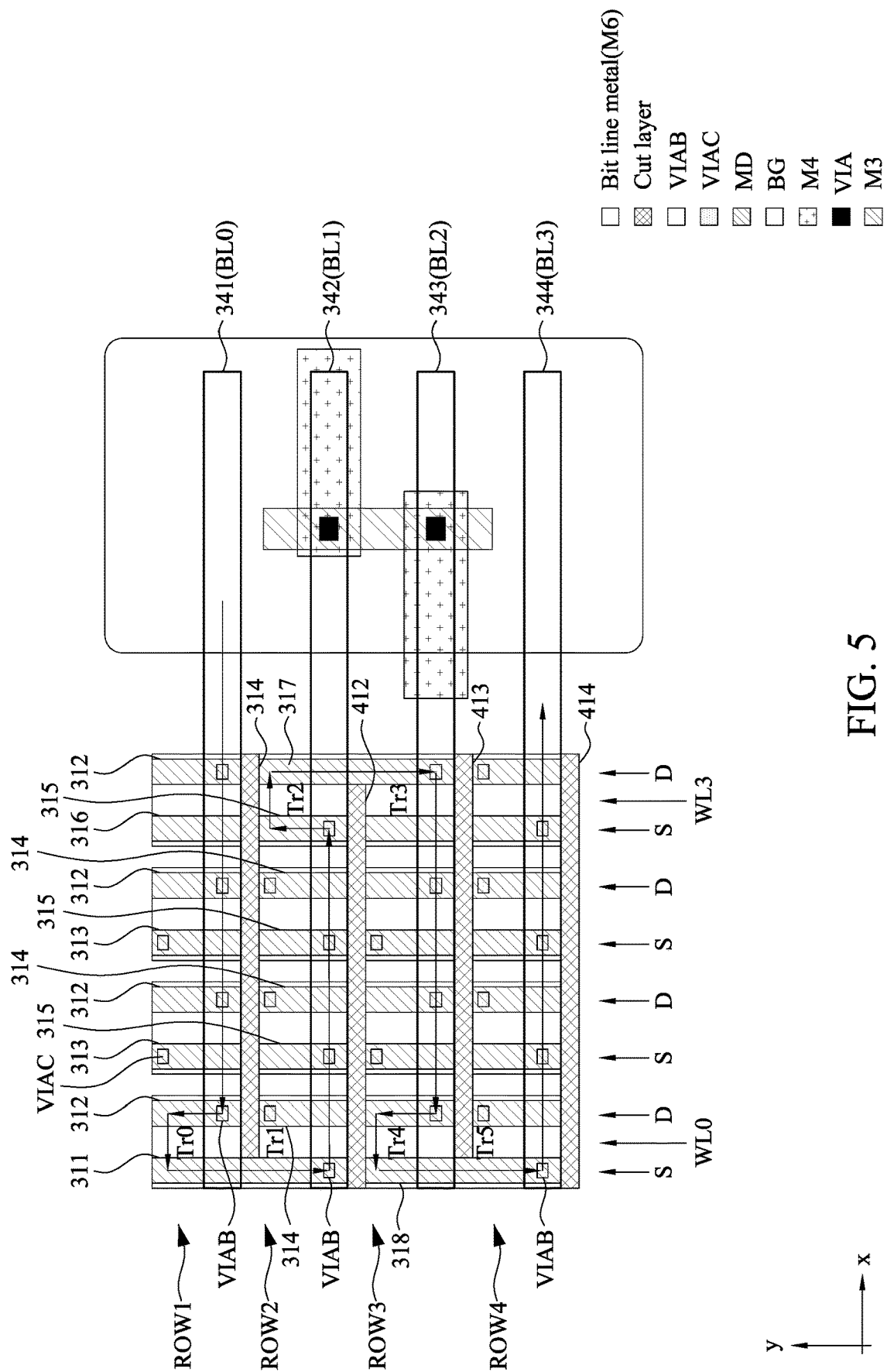
FIG. 5 is a layout diagrams in a plan view of a memory device corresponding to FIGS. 4A-4B, in accordance with some embodiments.

The method 30 includes operations of forming multiple memory cells MC of the memory array 121, as shown in, for example, FIGS. 4A-5. FIGS. 4A-4B are 3D schematic diagrams of part of a memory device corresponding to FIGS. 1 and 2A-2B, and is a layout diagrams in a plan view of a memory device corresponding to FIGS. 4A-4B, in accordance with some embodiments. With reference to FIG. 4A, according to some embodiments, the method 30 includes operations of forming a conductive layer 440 coupled to a ground potential in a layer above the layer in which the memory array 121 is arranged. The conductive layer 440 corresponds to the conductive layer 130 of FIG. 1 and corresponds to portions, of the capacitor structure 241 of FIG. 2B, coupled to the ground.

With reference to FIGS. 4A to 5, in operation 31, conductive segments, for example, 311, 313, 315, 316, 318 extending in y direction are formed. In some embodiments, the conductive segment 311, 313, 315, 316, 318 are configured with respect to, for example, the conductive segments 311 in FIG. 2B.

In operation 32, cut layers 411-413 extending in x direction are formed to separate the conductive segments 313 (e.g., coupled to the conductive layer 440 through vias VIAC and referred to as source structures of first type) from the conductive segments 315 (e.g., coupled to corresponding one of the bit lines 341-344 through vias VIAB and referred to as source structures of second type) in rows ROW1-ROW4 extending in x direction. Specifically, the conductive segments 313 in the rows ROW1 and ROW3 are coupled to the conductive layer 440. The conductive segments 315 in the rows ROW2 are coupled to the bit line 342. The conductive segments 315 in the rows ROW4 are coupled to the bit line 344.

In some embodiments, the method further includes operations of forming conductive segments 312, 314, and 317 (e.g., referred to as drain structures) that are configured with respect to, for example, the conductive segments 312 in FIG. 2B and extend in y direction. The conductive segment 317 passes across the row ROW2 and the row ROW3. For illustration, the cut layers 411-413 separate the conductive segments 312, 314, and 317 from each other. For illustration, the conductive segments 312 in each row are coupled to a corresponding one of the bit lines 341-344 through the vias VIAB. The conductive segments 314 are coupled to the conductive layer 440 through the vias VIAC.

In a test operation to the memory array 121 according to some embodiments, as shown in FIGS. 4A-5, the transistors Tr0-Tr1, Tr4-Tr5 are turned on in response to the word line voltage applied on the word line 301 (e.g., referred to as WL0) and the transistors Tr2-Tr3 are turned on in response to the word line voltage applied on the word line 304 (e.g., referred to as WL3). In some embodiments, the transistors are configured with respect to, for example, the transistor Tr of FIGS. 1-2B. Accordingly, the conductive segment 312 in the row ROW1 conducts to the conductive segment 311. The conductive segment 316 in the row ROW2 conducts to the conductive segment 317. The conductive segment 312 in the row ROW3 conducts to the conductive segment 318. A signal S1 inputted from the bit line 341 is correspondingly transmitted to the bit line 344 in a loop including the via VIAB coupled to the conductive segment 312 in the row ROW1, the conductive segment 311, the via VIAB coupled between the conductive segment 311 and the bit line 342, the via VIAB coupled between the bit line 342 and the conductive segment 316, the conductive segment 317, the via VIAB coupled between the conductive segment 317 and the bit line 343, the via VIAB coupled between the bit line 343 and the conductive segment 312, the conductive segment 318, and the via VIAB coupled between the conductive segment 318 and the bit line 344. Alternatively stated, the bit lines in different rows are coupled to each other through conductive segments that overlap at least two bit lines in the layout view.

The configurations of FIG. 5 are given for illustrative purposes. Various implements are within the contemplated scope of the present disclosure. For example, in some embodiments, the memory device 10 includes more than 4 bit lines. Even number bit lines are configured with respect to, for example, the bit lines 341(BL0) and 343(BL2), and odd number bit lines are configured with respect to, for example, the bit lines 342(BL1) and 344(BL3).

As mentioned above, with the configurations of the present application, by removing cut layers between portions of source or drain structures to couple bit lines, a resistance of the conductive loop formed by bit lines is measured as the signal is transmitted therein. Furthermore, based on the measured resistance and/or a current/voltage value of coupled bit lines, whether the conductive loop is short with other circuit loops in the memory array or the loop is open is identified. Accordingly, the reliability of memory device is evaluated.

Figure 6:
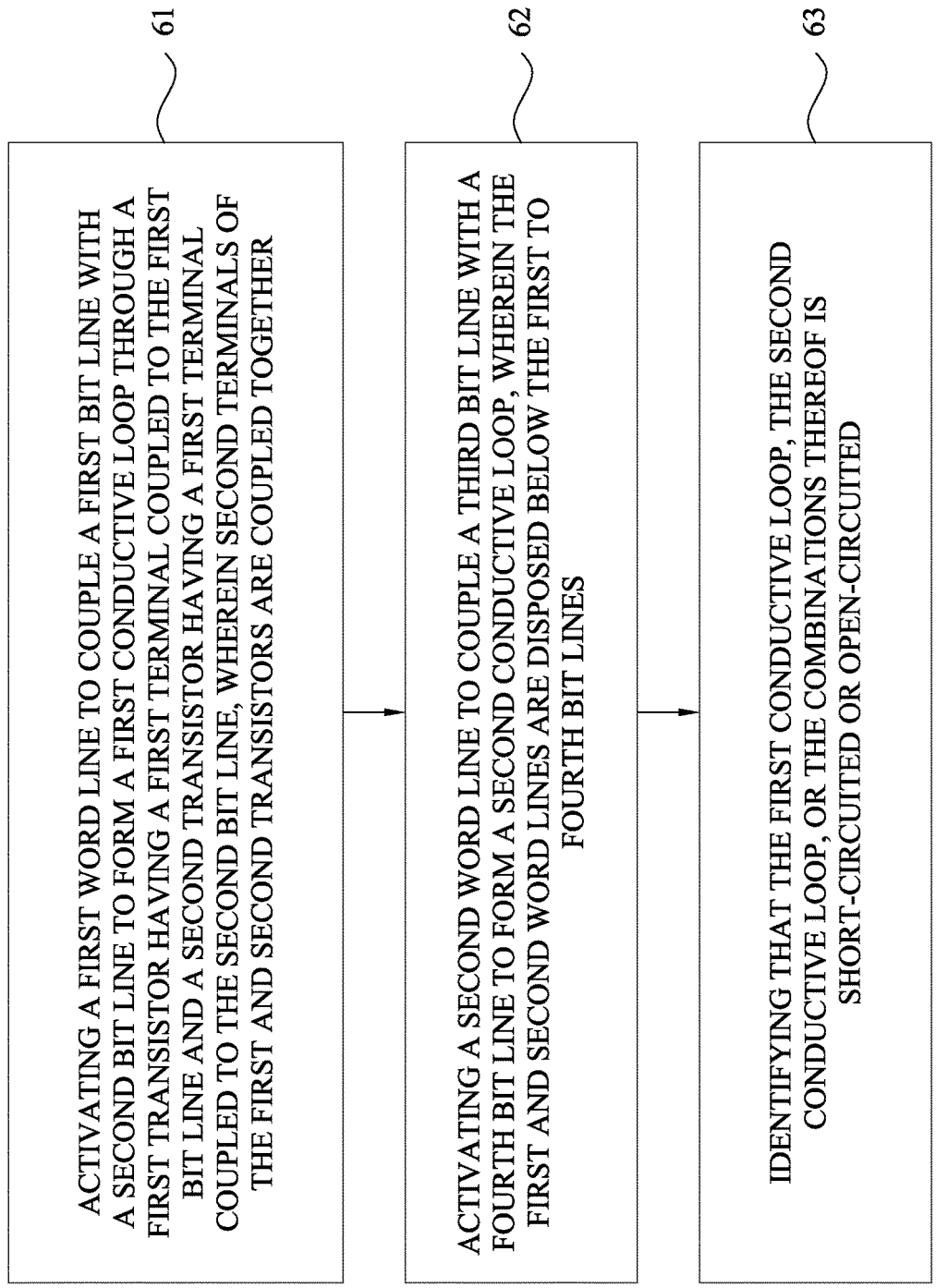
FIG. 6 is a flow chart of a method of a memory device, in accordance with some embodiments.
Figure 7:
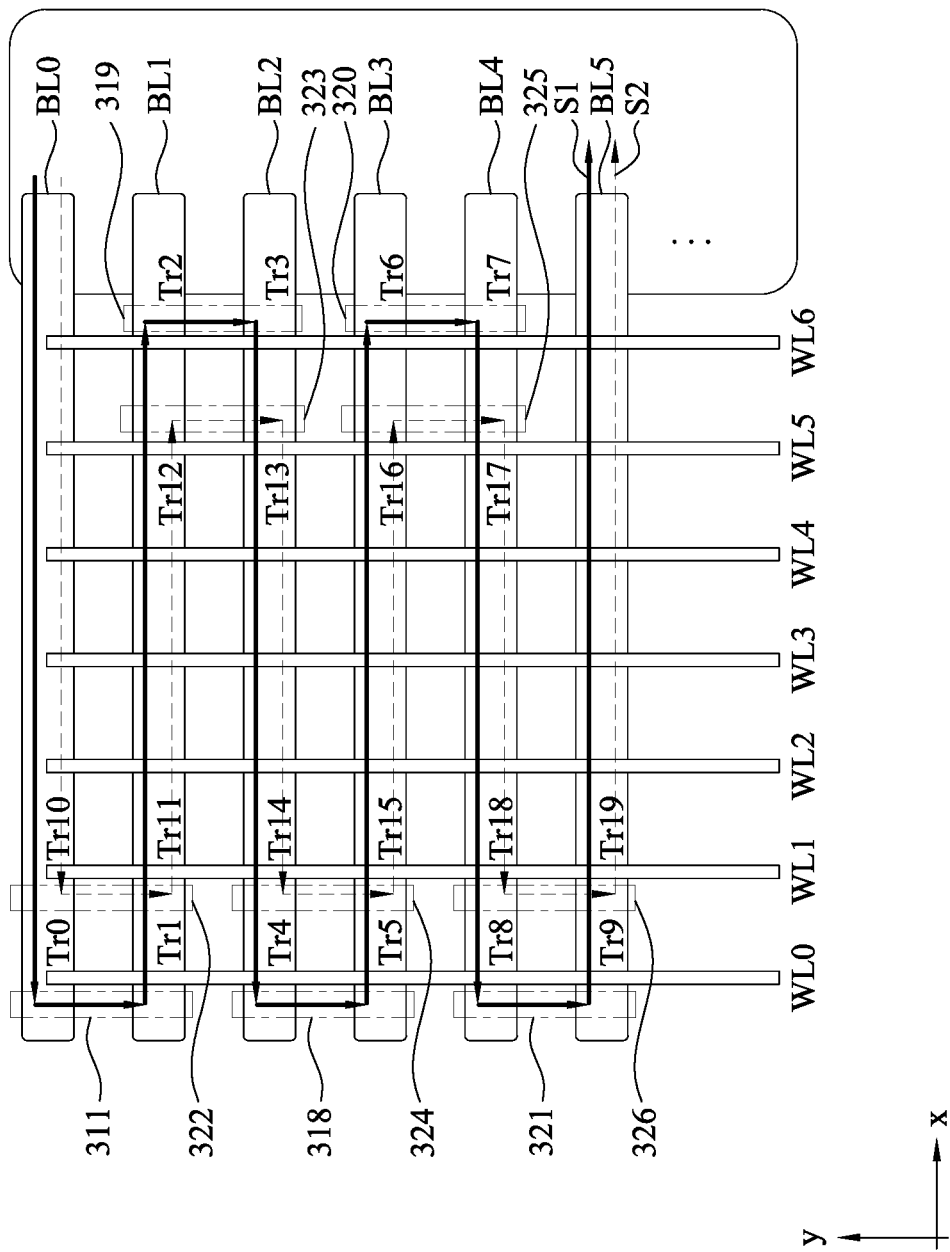
FIG. 7 is a schematic diagram of part of a memory device, in accordance with some embodiments.
Figure 8:
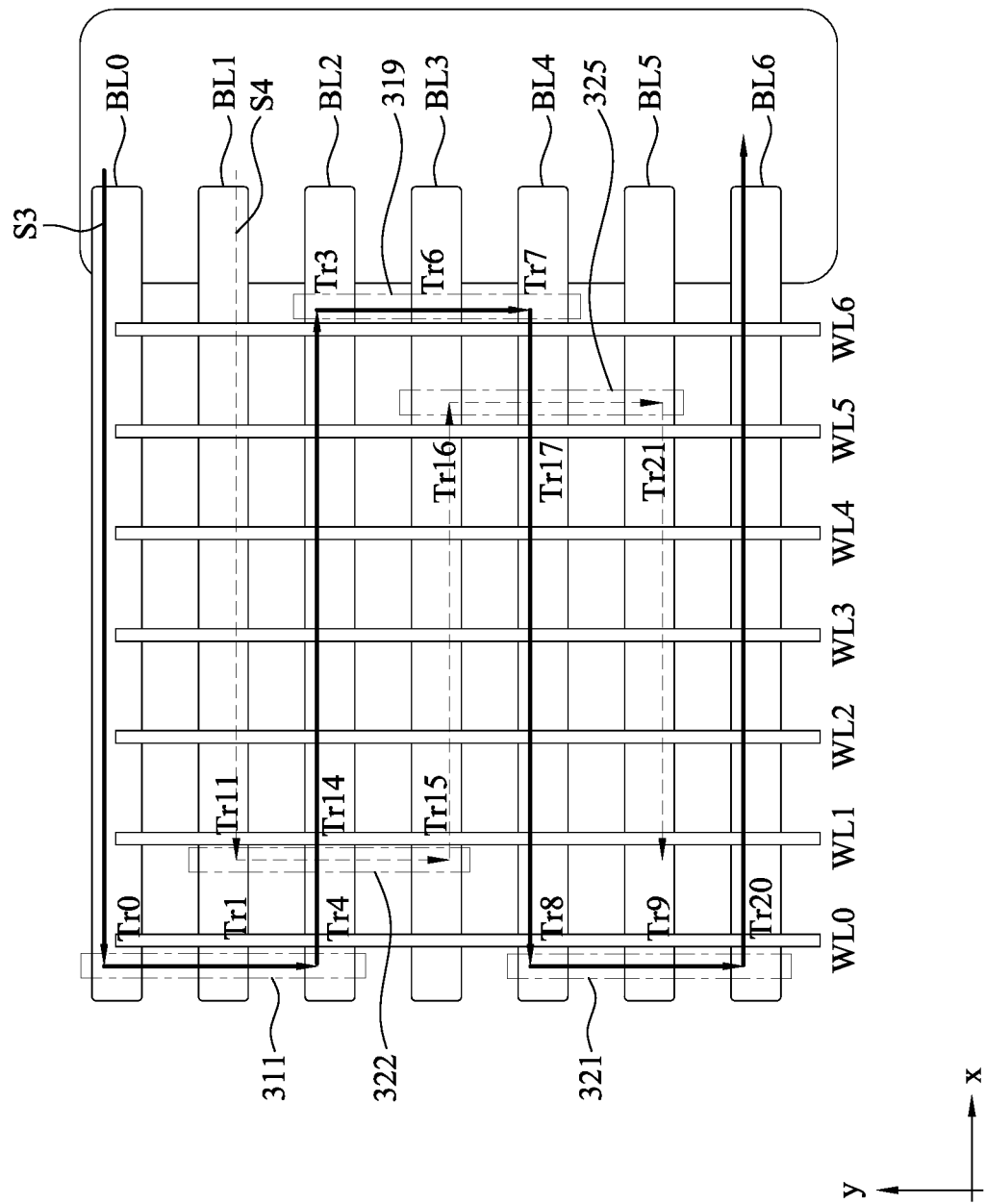
FIG. 8 is a schematic diagram of part of a memory device, in accordance with some embodiments.
Figure 9:
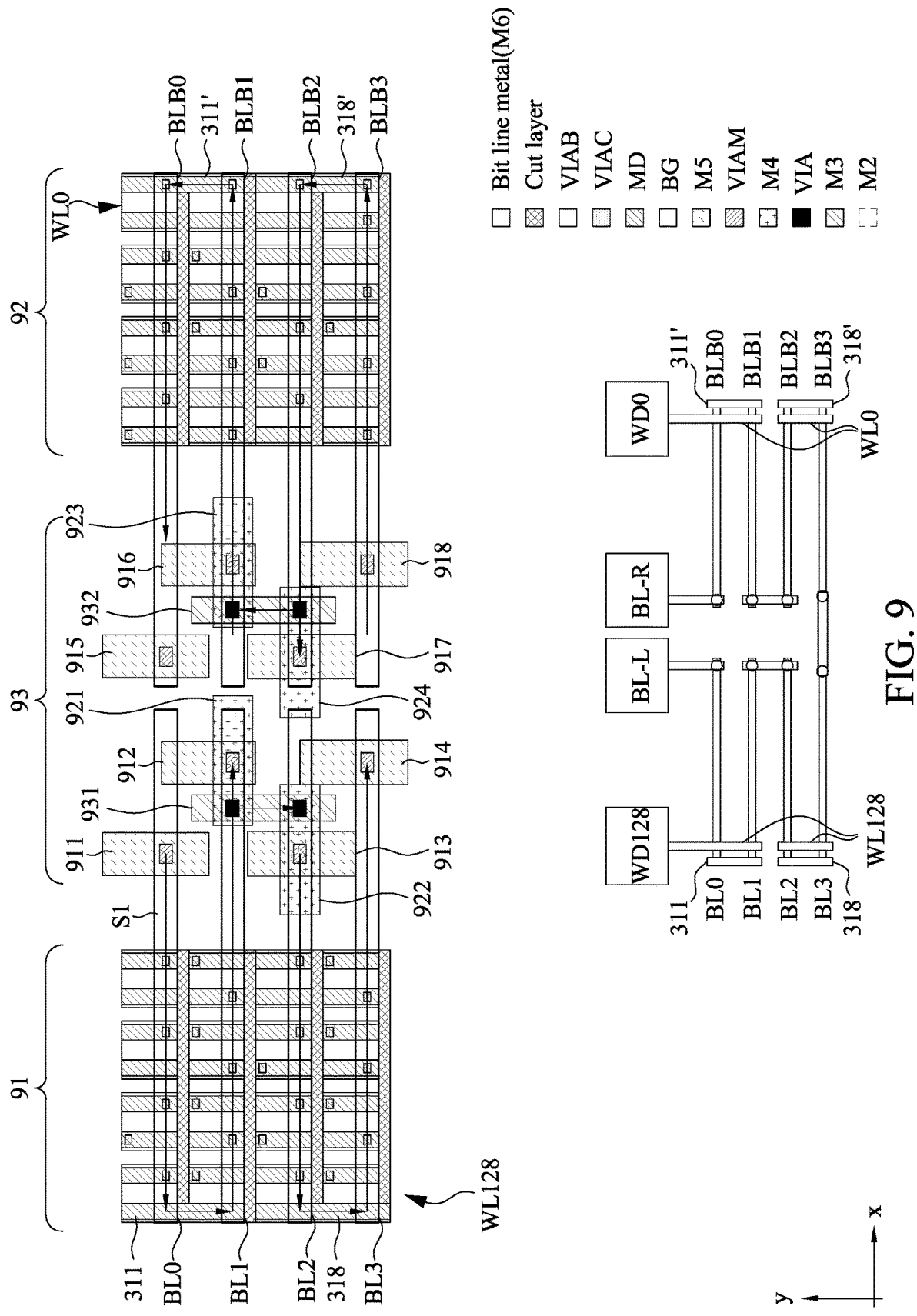
FIG. 9 is a schematic diagram of part of a memory device, in accordance with some embodiments.
Figure 10:
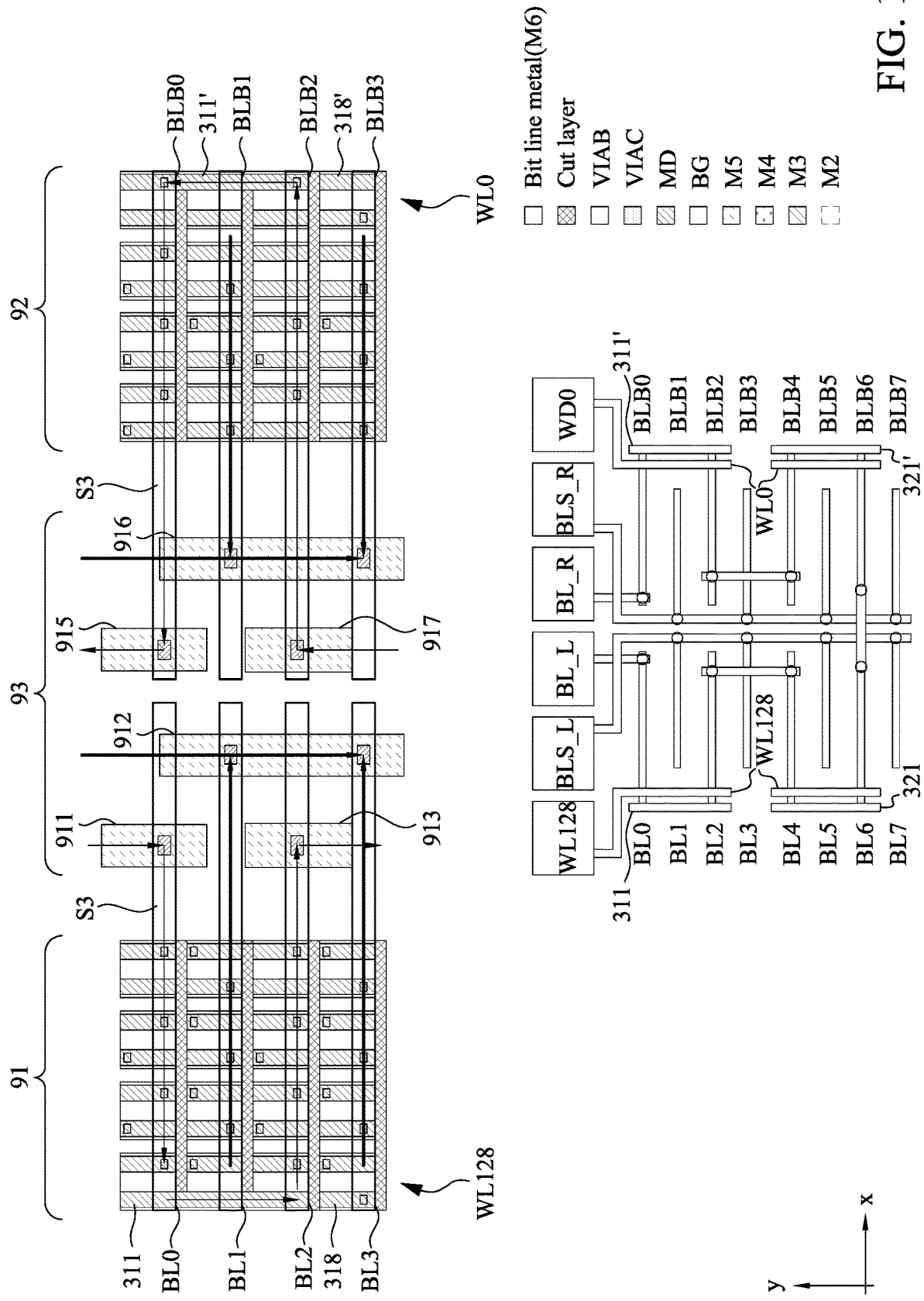
FIG. 10 is a schematic diagram of part of a memory device, in accordance with some embodiments.
Figure 11:
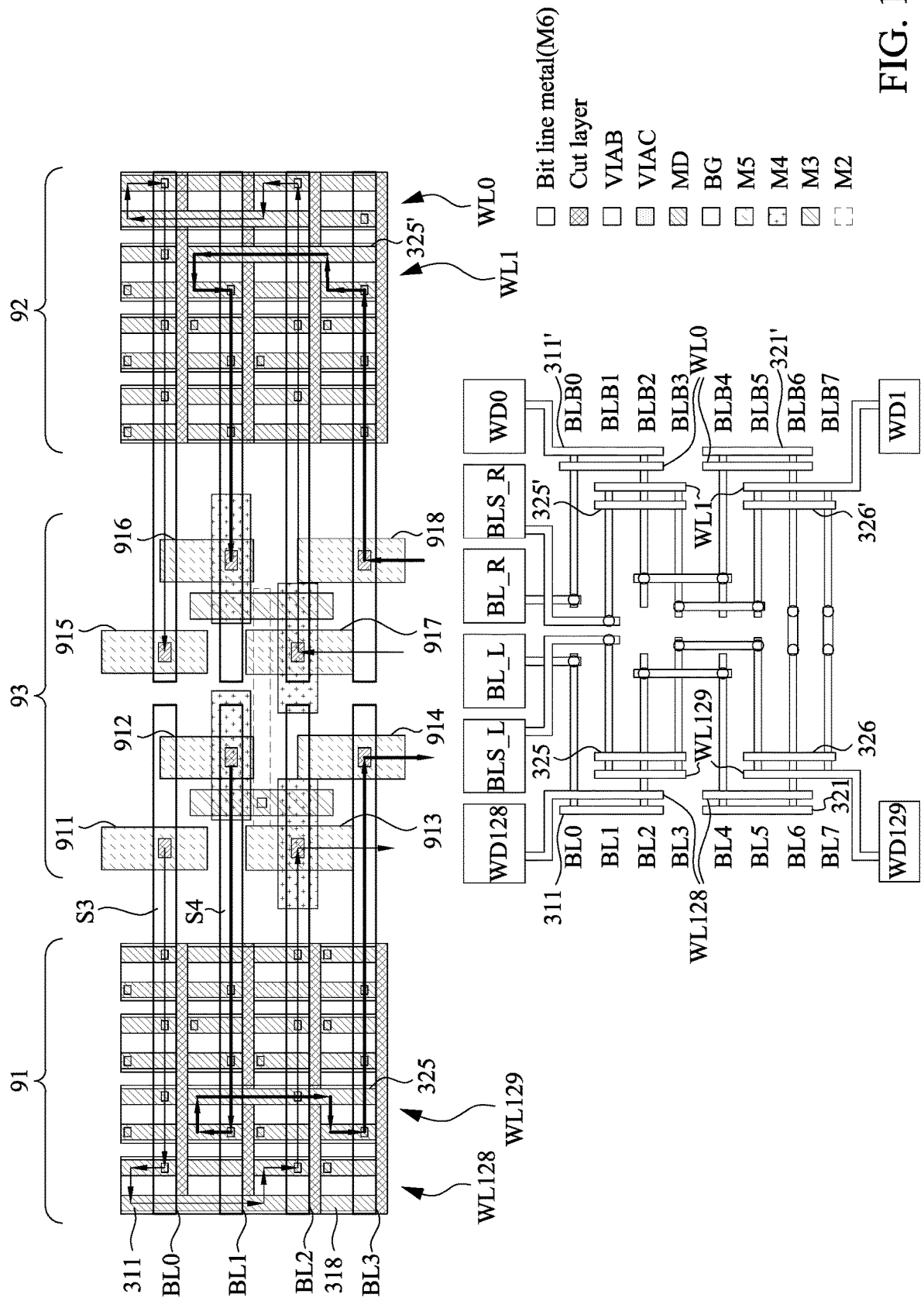
FIG. 11 is a schematic diagram of part of a memory device, in accordance with some embodiments.

In the following paragraphs, several test patterns for bit lines implemented in a method 60 of FIG. 6 are discussed with reference to memory devices having various configurations in FIGS. 7-11. For example, FIGS. 7, 9 and 11 illustrate that a short circuit test is performed to the memory array 121 for a purposed of checking whether the bit lines are short or, alternatively stated, the input and output terminals of the conductive loop formed by coupled bit lines are short-circuited, according to some embodiments. FIGS. 8, 10 and 11 illustrate that an open circuit test is performed to the memory array 121 for a purposed of checking whether the bit lines are open or, alternatively stated, whether there is any leakage between two conductive loops, according to some embodiments.

It is understood that additional operations can be provided before, during, and after the processes shown by FIG. 6, and some of the operations described below can be replaced or eliminated, for additional embodiments of the method. The order of the operations/processes may be interchangeable. Throughout the various views and illustrative embodiments, like reference numbers are used to designate like elements.

The method 60 includes operations 61-63 that are described below with reference to the memory device in FIGS. 1-13. With respect to FIGS. 1-5, like elements in FIGS. 7-13 are designated with the same reference numbers for ease of understanding. The specific operations of similar elements, which are already discussed in detail in the above paragraphs, are omitted herein for the sake of brevity, unless there is a need to introduce the co-operation relationship with the elements shown in FIGS. 7-13.

As shown in FIG. 7, the memory device 10 further includes conductive segments 321, 322, 324, 326 that are configured with respect to, for example, the conductive segments 311 of FIG. 5, and includes conductive segments 319, 320, 323, and 325 that are configured with respect to, for example, the conductive segment 317 of FIG. 5. In addition, the transistors Tr6-Tr7 are configured with respect to, for example, the transistors Tr2-Tr3 of FIG. 5. The transistors Tr8-Tr9 are configured with respect to, for example, the transistors Tr4-Tr5 of FIG. 5. The transistors Tr10-Tr11, Tr14-Tr15, Tr18-Tr19 are configured with respect to, for example, the transistors Tr0-Tr1 of FIG. 5. The transistors Tr12-Tr13, and Tr16-Tr17 are configured with respect to, for example, the transistors Tr2-Tr3 of FIG. 5. In some embodiments, the transistors Tr0-Tr1, Tr4-Tr5, and Tr8-Tr9 are configured to operate in response to a word line signal in the word line WL0. The transistors Tr10-Tr11, Tr14-Tr15, and Tr18-Tr19 are configured to operate in response to a word line signal in the word line WL1. The transistors Tr12-Tr13, and Tr16-Tr17 are configured to operate in response to a word line signal in the word line WL5. The transistors Tr2-Tr3, and Tr6-Tr7 are configured to operate in response to a word line signal in the word line WL6.

In operation 61 of the method 60, with reference to FIG. 7, the word line WL0 is activated to couple the bit line BL0 with the bit line BL1 to form a conductive loop through the turned-on transistors Tr0-Tr1, in which the conductive segment 311 corresponds to two coupled terminals of the transistors Tr0-Tr1. Accordingly, by contacting the bit lines BL0-BL1, for example by test probes, a resistance (e.g., R1) between the bit lines BL0-BL1 is measured and obtained.

In operation 62, the word line WL6 in FIG. 7 is activated to couple the bit line BL3 with the bit line BL4 to form a conductive loop through the turned-on transistors Tr6-Tr7, in which the conductive segment 320 corresponds to two coupled terminals of the transistors Tr6-Tr7. Accordingly, by contacting the bit lines BL3-BL4, a resistance (e.g., R2) between the bit lines BL3-BL4 is measured and obtained.

In operation 63, the conductive loop formed by the bit lines BL0-BL1, the conductive loop formed by the bit lines BL3-BL4, or the combinations thereof is identified short-circuited. For instance, when the resistance R1 is not infinite and in a range of normal metal routing resistance, it indicates that the conductive loop formed by the bit lines BL0-BL1 is short-circuited. Alternatively stated, each of the bit lines BL0-BL1 has no defects that cause open circuits and the bit lines BL0-BL1 pass the test. In contrast, when the resistance R1 is infinite, it indicates that the conductive loop formed by the bit lines BL0-BL1 is open-circuited. Alternatively stated, one or both of the bit lines BL0-BL1 has defects and the bit lines BL0-BL1 do not pass the test. The configurations of the conductive loop formed by the bit lines BL3-BL4 are similar to the conductive loop formed by the bit lines BL0-BL1. Hence, the repetitious descriptions are omitted here.

Moreover, based on the embodiments mentioned above, when the word lines WL0, WL6 are activated and the word lines WL1-WL5 are idled, the transistors Tr0-Tr9 are turned on to form a conductive loop for transmitting the signal S1 from the bit line BL0 to the bit line BL5. A corresponding resistance of the conductive loop is obtained for identifying whether the conductive loop is short-circuited or open-circuited, and accordingly reliability of the bit lines BL0-BL5 is evaluated. In various embodiments, when the word lines WL1, WL5 are activated and the word lines WL0, WL2-4, WL6 are idled, the transistors Tr10-Tr19 are turned on to form a conductive loop for transmitting the signal S2 from the bit line BL0 to the bit line BL5. A corresponding resistance of the conductive loop is obtained for identifying whether the conductive loop is short-circuited or open-circuited, and accordingly reliability of the bit lines BL0-BL5 is also evaluated.

The configurations of FIGS. 4A-7 are given for illustrative purposes. Various implements are within the contemplated scope of the present disclosure. For example, in some embodiments, other continued conductive segments corresponding to other word lines, rather than the word line WL0-WL1, WL5-6, are formed in order to test conductive paths of the bit lines regarding different length and different sequence.

Reference is now made to FIG. 8. FIG. 8 is a schematic diagram of part of the memory device 10, in accordance with some embodiments In some embodiments, a circuit relationship between a conductive loop transmitting a signal S3 and a conductive loop transmitting a signal S4 is identified. Specifically, compared with FIG. 7, the word line WL0 is further coupled to the transistors Tr0, Tr1, Tr4, Tr8, Tr9, and Tr20, in which the conductive segment 311 corresponds to coupled terminals of the transistors Tr0, Tr1, and Tr4 and the conductive segment 321 corresponds to coupled terminals of the transistors Tr8, Tr9, and Tr20. The word line WL1 is coupled to the transistors Tr10, Tr11, and Tr21, in which the conductive segment 322 corresponds to coupled terminals of the transistors Tr11, Tr14, and Tr15. The word line WL5 is coupled to the transistors Tr16, Tr17, and Tr22, in which the conductive segment 325 corresponds to coupled terminals of the transistors Tr16, Tr17, and Tr21. The word line WL6 is coupled to the transistors Tr3, Tr6, and Tr7, in which the conductive segment 319 corresponds to coupled terminals of the transistors Tr3, Tr6, and Tr7.

As shown in FIG. 8, the method 60 further includes activating the word lines WL0 and WL6 to turn on the transistors Tr0-Tr1, Tr3-Tr4, Tr6-Tr9, and Tr20 to form the conductive loop transmitting the signal S3 through the bit line BL0, the conductive segment 311, the bit line BL2, the conductive segment 319, the bit line BL4, the conductive segment 321, and the bit line BL6. Alternatively stated, the even number of bit lines are coupled together. Similarly, the method 60 further includes activating the word lines WL1 and WL5 to turn on the transistors Tr11, Tr14-15, Tr16-Tr17, and Tr21 to form the conductive loop transmitting the signal S4 through the bit line BL1, the conductive segment 322, the bit line BL3, the conductive segment 325, and the bit line BL5. Alternatively stated, the odd number of bit lines are coupled together. Furthermore, by contacting one of the even number of bit lines and one of the odd number of bit lines, for example, the bit lines BL0-BL1, through the test probes, a resistance (e.g., R3) between two conductive loops is measured and obtained.

In some embodiments, when the resistance R3 is not infinite and in a range of normal metal routing resistance, it indicates that the conductive loops transmitting the signals S3-S4 are short-circuited. Alternatively stated, defects exist among the bit lines BL0-BL5 and cause leakages of signals. The bit lines BL0-BL5 do not pass the open circuit test. In contrast, when the resistance R3 is infinite, it indicates that the conductive loops are open-circuited. Alternatively stated, each of the bit lines BL0-BL5 has no defects that cause short circuits and the bit lines BL0-BL5 pass the test.

The configurations of FIGS. 7-8 are given for illustrative purposes. Various implements are within the contemplated scope of the present disclosure. For example, in some embodiments, the memory device 10 includes more than 7 bit lines and word lines.

Reference is now made to FIG. 9. FIG. 9 is a schematic diagram of part of the memory device 10, in accordance with some embodiments. The memory device 10 in the embodiments of FIG. 9 includes memory regions 91-92 and metal routing region 93 interposed between the memory regions 91-92. Compared with FIGS. 5 and 7, the signal S1 is transmitted through the bit lines BL0-BL3 in the memory region 91 and bit lines BLB0-BLB3 in the memory region 92. With the configurations of the present application, bit lines in all memory regions 91-92 are tested based on the identification of the conductive loop formed by the bit lines and being short-circuited or open-circuited. In some embodiments, the memory region 92 is configured with respect to, for example, the memory region 91 which is configured with respect to, for example, the embodiments of FIG. 5. For illustration, bit lines BLB0-BLB3 are formed in the memory region 92 and of metal-six layers (M6).

The memory device 10 further includes conductive lines 911-918 (e.g., metal-five layer M5) that are in a layer below the bit lines BL0-BL3 and the bit lines BLB0-BLB3, conductive lines 921-924 (e.g., metal-fourth layer M4) below the metal-five layers, conductive lines 931-932 (e.g., metal-three layer M3) below the metal-five layers. For illustration, the conductive lines 911-918 and the conductive lines 931-932 extend in y direction, and the conductive lines 921-924 extend in x direction.

Specifically, the word line WL128 in the memory region 91 and the word line WL0 in the memory region 92 are activated by word line drivers WD128 and WD0 to turn on transistors that are coupled to the bit lines BL0-BL3, BLB0-BLB3 and word lines WL0 and WL128. In some embodiments, the word line drivers WD128 and WD0 are arranged in the word line driver region 111 of FIG. 1. Accordingly, the signal S1 is inputted from a bit line contact BL_L through the conductive line 911 coupled to the bit line BL0 by a via, and further transmitted through the conductive segment 311, the bit line BL1, the conductive lines 912, 921, 931, 922, 913, the bit line BL2, the conductive segment 318, the bit line BL3, the conductive line 914 that are in the memory region 91. In some embodiments, the memory device further includes conductive lines (e.g., conductive lines in M2 and M3) configured to connect the bit line BL3 in the memory region 91 and the bit line BLB3 in the memory region 92. In addition, the signal S1 is further transmitted to the a bit line contact BL_R through the conductive line 918 coupled to the bit line BLB3 by a via, and further transmitted through the conductive segment 318', the bit line BLB2, the conductive lines 917, 924, 932, 923, 916, the bit line BLB1, the conductive segment 311', the bit line BLB0, the conductive line 915 that are in the memory region 92. The conductive lines 911 and 915 are coupled to the bit line contacts BL_L and BL_R respectively.

The configurations of FIG. 9 are given for illustrative purposes. Various implements are within the contemplated scope of the present disclosure. For example, in some embodiments, the memory device 10 includes more than 4 bit lines in a memory region and the bit lines are coupled in a serpentine loop for testing.

Reference is now made to FIG. 10. FIG. 10 is a schematic diagram of part of the memory device 10, in accordance with some embodiments. Compared with FIG. 9, the conductive segment 311 is coupled between the bit line BL0 and BL2, and the conductive segment 311' is coupled between the bit line BLB0 and BLB2. A conductive loop 901 is formed by the even number of bit lines, BL0, BL2, BL4, BL6 in the memory region 91 and BLB0, BLB2, BLB4, BLB6 in the memory region 92, the conductive lines 911, 913, 915, 917, and the conductive segments 311, 321, 311', 321' to transmit the signal S3 between the bit line contacts BL_L and BL_R. Another conductive loop (path) 902 is formed by a bit line contact BLS_L, the conductive line 912, and the odd number of bit lines, BL1, BL3, BL5, BL7 in the memory region 91. The other conductive loop 903 (path) is formed by a bit line contact BLS_R, the conductive line 916, and the odd number of bit lines, BLB1, BLB3, BLB5, BLB7 in the memory region 92.

In some embodiments, at least three different test patterns are implemented to the memory device 10 in the FIG. 10. The first test pattern is to identify whether the conductive loop 901 is short-circuited or open-circuited. Specifically, the word lines WL128 and WL0 are activated. By measuring a resistance of the conductive loop 901 through connecting the bit line contacts BL_L and BL_R, the circuit condition of the conductive loop 901 is identified.

The second test pattern is to identify whether the conductive loop 901 and conductive loop 902 are short together or disconnected with other. Specifically, by connecting the bit line contact BLS_L with one of the bit line contacts BL_L and BL_R to measure a resistance therebetween, the circuit relationship between the conductive loops 901 and 902 is identified.

Similarly, the third test pattern is to identify whether the conductive loop 901 and conductive loop 903 are short together or disconnected with other. Specifically, by connecting the bit line contact BLS_R with one of the bit line contacts BL_L and BL_R to measure a resistance therebetween, the circuit relationship between the conductive loops 901 and 903 is identified.

The configurations of FIG. 10 are given for illustrative purposes. Various implements are within the contemplated scope of the present disclosure. For example, in some embodiments, the fourth test pattern is to identify whether the conductive loop 902 and conductive loop 903 are short together or disconnected with other. Specifically, by connecting the bit line contact BLS_L with the bit line contact BLS_R to measure a resistance therebetween, the circuit relationship between the conductive loops 902 and 903 is identified.

Reference is now made to FIG. 11. FIG. 11 is a schematic diagram of part of the memory device 10, in accordance with some embodiments. Compared with FIG. 10, instead of forming a conductive path by coupling the conductive line 912 between the bit lines BL1 and BL3 and forming a conductive path by coupling the conductive line 916 between the bit lines BLB1 and BLB3 in FIG. 10, the conductive segment 325 couples the bit lines BL1 and BL3 in the memory region 91 and the conductive segment 325' couples the bit lines BLB1 and BLB3 in the memory region 92.

Specifically, the word line WL129 in the memory region 91 and the word line WL1 in the memory region 92 are activated by word line drivers WD129 and WD1 to turn on transistors that are coupled to the bit lines BL1, BL3, BL5, BL7, BLB1, BLB3, BLB5, BLB7 and word lines WL1 and WL129. In some embodiments, the word line drivers WD129 and WD1 are arranged in the word line driver region 111 of FIG. 1. Accordingly, the signal S4 is inputted from the bit line contact BLS_L through the conductive line 912 coupled to the bit line BL1 by a via, and further transmitted through the conductive segment 315, the bit line BL3, the conductive line 914, the conductive segment 326, and the bit lines BL5 and BL7 that are in the memory region 91. In some embodiments, the memory device further includes conductive lines (e.g., conductive lines in M2-M5 layers) configured to connect the bit lines BL3, BL5, and BL7 in the memory region 91 and further to the bit line BLB7 in the memory region 92. Moreover, the signal S4 is further transmitted to the bit line contact BLS_R through the conductive segment 326', the conductive line 918 coupled to the bit line BLB3 by a via, and further transmitted through the conductive segment 325', the bit line BLB1, the conductive line 916 that are in the memory region 92. The conductive lines 912 and 916 are coupled to the bit line contacts BLS_L and BLS_R respectively.

In some embodiments, at least three different test patterns are implemented to the memory device 10 in the FIG. 11. The first test pattern is to identify whether the conductive loop, transmitting the signal S3, is short-circuited or open-circuited. Specifically, the word lines WL128 and WL0 are activated. By measuring a resistance of the conductive loop through connecting the bit line contacts BL_L and BL_R, the circuit condition of the conductive loop is identified.

The second test pattern is to identify whether the conductive loop, transmitting the signal S4, is short-circuited or open-circuited. Specifically, the word lines WL129 and WL1 are activated. By measuring a resistance of the conductive loop through connecting the bit line contacts BLS_L and BLS_R, the circuit condition of the conductive loop is identified.

The third test pattern is to identify whether the conductive loops transmitting the signals S3-S4 are short together or disconnected with other. Specifically, by connecting one of the bit line contacts BLS_L, BLS_R with one of the bit line contacts BL_L, BL_R to measure a resistance therebetween, the circuit relationship between the conductive loops is identified.

The configurations of FIG. 11 are given for illustrative purposes. Various implements are within the contemplated scope of the present disclosure. For example, in some embodiments, the memory device 10 includes more than 8 bit lines in a memory region and the bit lines are coupled in a serpentine loop for testing.

Figure 12:
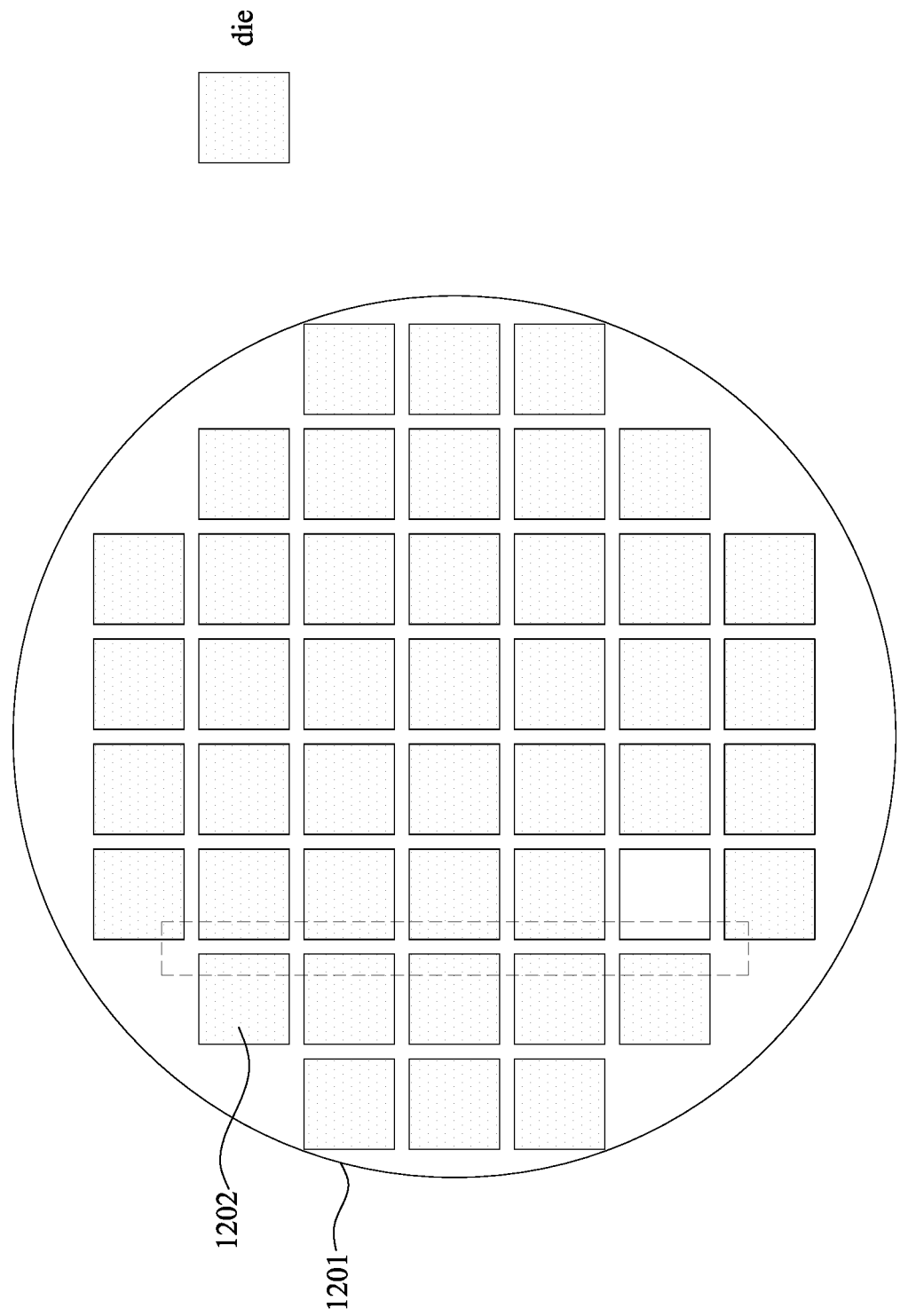
FIG. 12 is a schematic diagram of a wafer, in accordance with some embodiments.

Reference is now made to FIG. 12. FIG. 12 is a schematic diagram of a wafer 1201, in accordance with some embodiments. For illustration, the wafer 1201 includes multiple dies 1202 that are separated from each other. In some embodiments, each of the dies 1202 includes memory devices having memory cells configured with respect to, for example, the memory cell MC of FIGS. 2A-2B. For the purposes of monitoring bit line reliability in manufacturing memory devices, the memory device 10, for example, provided in FIGS. 1-11 for testing, are formed in scribe lines as circled in dash line between the dies 1202. As the memory device 10 for testing and the memory devices being shipped are manufactured together in the same processes and the quality of the bit lines therein are considered similar to each other, reliability of the memory devices being shipped are predicted based on the test results of the memory device 10. Accordingly, failed memory devices are found and screened out before shipping. Alternatively stated, yield for the bit lines of BEOL process memory is carefully monitored.

Figure 13:
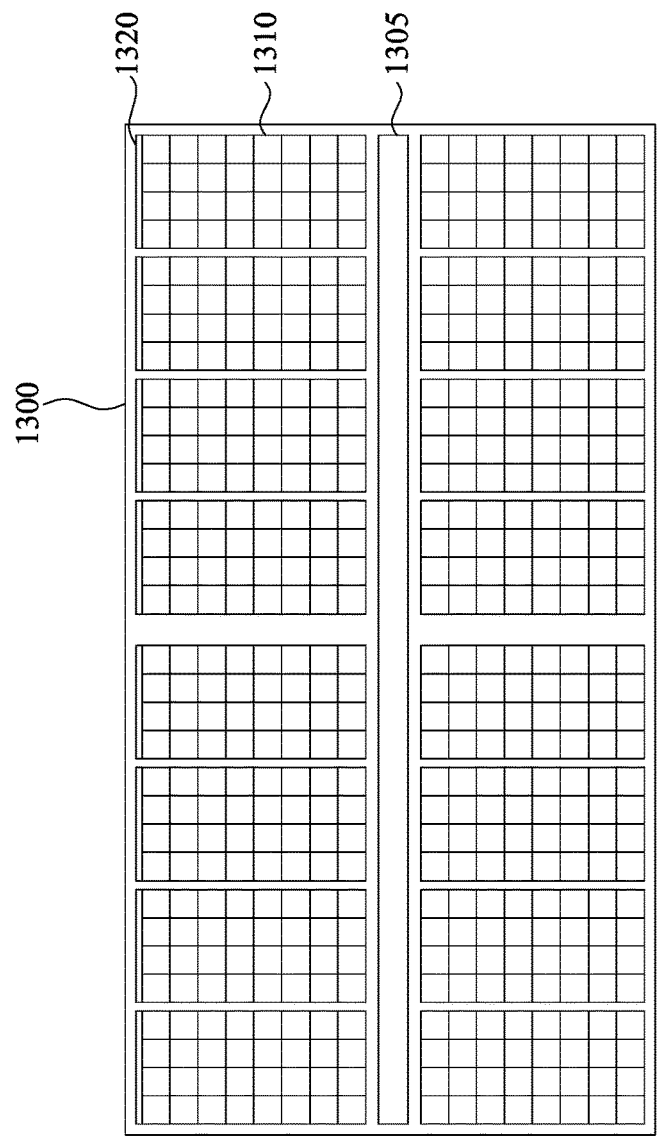
FIG. 13 is a schematic diagram of part of a memory device, in accordance with some embodiments.
Figure 13:
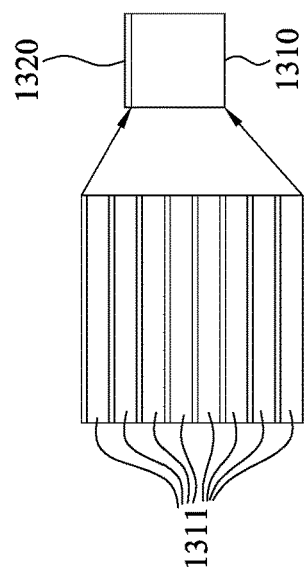

Reference is now made to FIG. 13. FIG. 13 is a schematic diagram of a memory device 1300, in accordance with some embodiments. For illustration, the memory device 1300 includes a control circuit region 1305 and multiple memory banks 1310 having channel regions 1320 formed attached thereto. In some embodiments, the memory bank 1310 further includes multiple memory arrays 1311 arranged in the row direction. In some embodiments, the memory array, for example 121 for testing, is formed in one or more of the memory arrays in the memory banks 1310, the channel regions 1320, or the combinations thereof.

Figure 14:
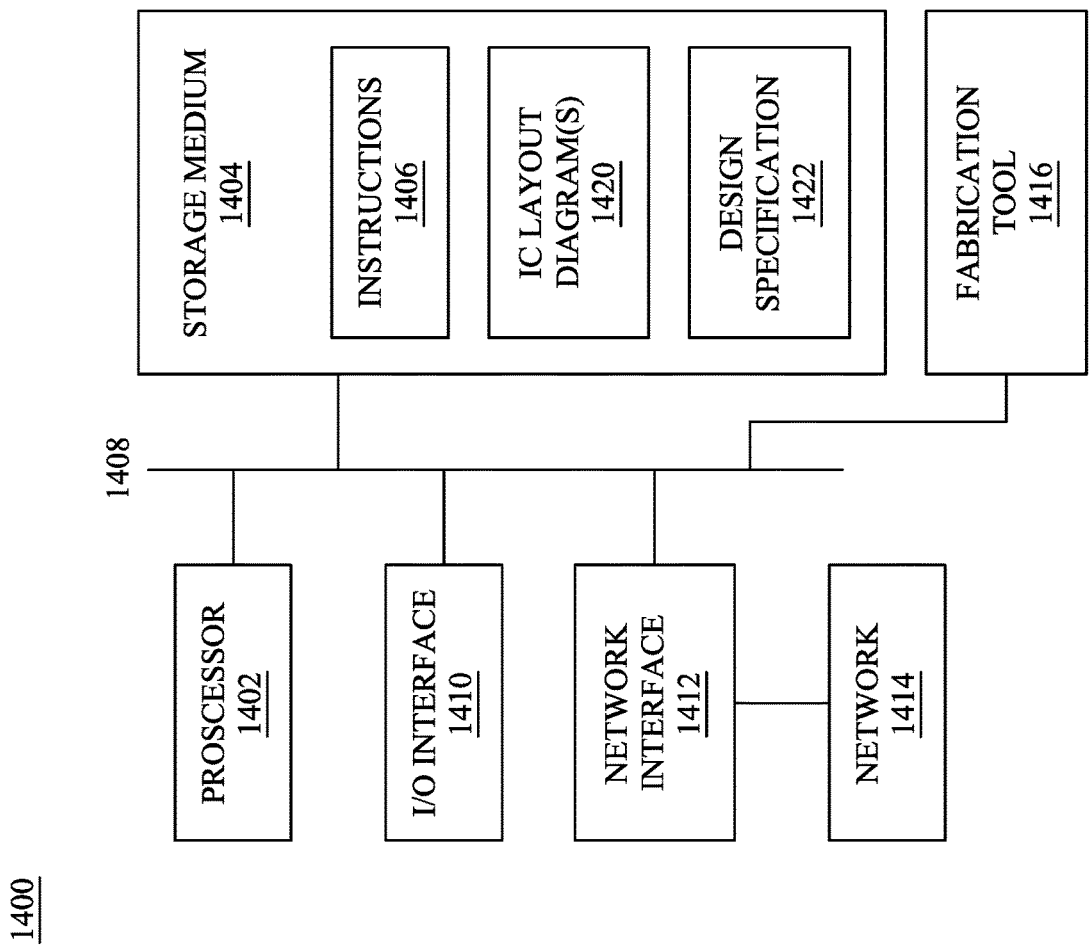
FIG. 14 is a block diagram of a system for designing an integrated circuit layout design, in accordance with some embodiments of the present disclosure.

Reference is now made to FIG. 14. FIG. 14 is a block diagram of an electronic design automation (EDA) system 1400 for designing the integrated circuit layout design, in accordance with some embodiments of the present disclosure. EDA system 1400 is configured to implement one or more operations of the method 30 disclosed in FIG. 3 and further explained in conjunction with FIGS. 1-2B, 5, 7-13. In some embodiments, EDA system 1400 includes an APR system.

In some embodiments, EDA system 1400 is a general purpose computing device including a hardware processor 1402 and a non-transitory, computer-readable storage medium 1404. Storage medium 1404, amongst other things, is encoded with, i.e., stores, computer program code (instructions) 1406, i.e., a set of executable instructions. Execution of instructions 1406 by hardware processor 1402 represents (at least in part) an EDA tool which implements a portion or all of, e.g., the method 30.

The processor 1402 is electrically coupled to computer-readable storage medium 1404 via a bus 1408. The processor 1402 is also electrically coupled to an I/O interface 1410 and a fabrication tool 1416 by bus 1408. A network interface 1412 is also electrically connected to processor 1402 via bus 1408. Network interface 1412 is connected to a network 1414, so that processor 1402 and computer-readable storage medium 1404 are capable of connecting to external elements via network 1414. The processor 1402 is configured to execute computer program code 1406 encoded in computer-readable storage medium 1404 in order to cause EDA system 1400 to be usable for performing a portion or all of the noted processes and/or methods. In one or more embodiments, processor 1402 is a central processing unit (CPU), a multi-processor, a distributed processing system, an application specific integrated circuit (ASIC), and/or a suitable processing unit.

In one or more embodiments, computer-readable storage medium 1404 is an electronic, magnetic, optical, electromagnetic, infrared, and/or a semiconductor system (or apparatus or device). For example, computer-readable storage medium 1404 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1404 includes a compact disk-read only memory (CD-ROM), a compact disk-read/write (CD-R/W), and/or a digital video disc (DVD).

In one or more embodiments, storage medium 1404 stores computer program code 1406 configured to cause EDA system 1400 (where such execution represents (at least in part) the EDA tool) to be usable for performing a portion or all of the noted processes and/or methods. In one or more embodiments, storage medium 1404 also stores information which facilitates performing a portion or all of the noted processes and/or methods. In one or more embodiments, storage medium 1404 stores library 1420 of IC layout diagram of standard cells including such standard cells as disclosed herein, for example, the memory devices discussed above with respect to FIGS. 1-2B, 5, 7-13.

EDA system 1400 includes I/O interface 1410. I/O interface 1410 is coupled to external circuitry. In one or more embodiments, I/O interface 1410 includes a keyboard, keypad, mouse, trackball, trackpad, touchscreen, and/or cursor direction keys for communicating information and commands to processor 1402.

EDA system 1400 also includes network interface 1412 coupled to processor 1402. Network interface 1412 allows EDA system 1400 to communicate with network 1414, to which one or more other computer systems are connected. Network interface 1412 includes wireless network interfaces such as BLUETOOTH, WIFI, WIMAX, GPRS, or WCDMA; or wired network interfaces such as ETHERNET, USB, or IEEE-1464. In one or more embodiments, a portion or all of noted processes and/or methods, is implemented in two or more systems 1400.

EDA system 1400 also includes the fabrication tool(s) 1416 coupled to processor 1402. The fabrication tools 1416 are configured to fabricate integrated circuits, e.g., the memory devices in FIGS. 1-2B, 5, 7-13, according to the design files processed by the processor 1402. In some embodiments, the fabrication tools 1416 perform various semiconductor processes including, for example, generating photomasks based on layouts, fabricating using the photomasks, etching, deposition, implantation, and annealing. The fabrication tools 1416 include, for example, photolithography steppers, etch tools, deposition tools, polishing tools, rapid thermal anneal tools, ion implantation tools, and the like. Each fabrication tool 1416 modifies the wafer according to a particular operating recipe. For illustration, one fabrication tool 1416 is configured to deposit a film having a certain thickness on a wafer, and another fabrication tool 1416 is configured to etch away a layer from a wafer. Furthermore, in some embodiments, the fabrication tools 1416 of the same type are designed to perform the same type of process.

EDA system 1400 is configured to receive information through I/O interface 1410. The information received through I/O interface 1410 includes one or more of instructions, data, design rules, libraries of standard cells, and/or other parameters for processing by processor 1402. The information is transferred to processor 1402 via bus 1408. EDA system 1400 is configured to receive information related to a UI through I/O interface 1410. The information is stored in computer-readable medium 1404 as design specification 1422.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1400. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 15:
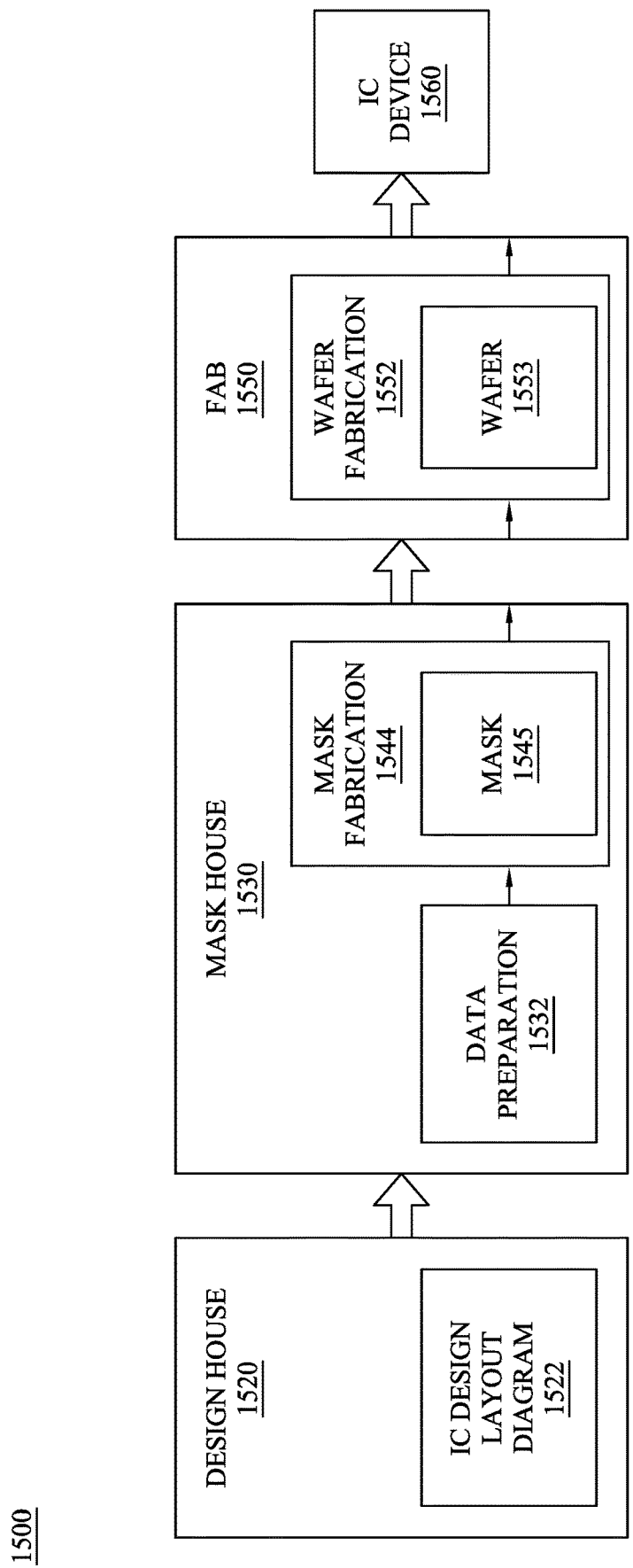
FIG. 15 is a block diagram of an integrated circuit manufacturing system, and an integrated circuit manufacturing flow associated therewith, in accordance with some embodiments.

FIG. 15 is a block diagram of IC manufacturing system 1500, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1500.

In FIG. 15, IC manufacturing system 1500 includes entities, such as a design house 1520, a mask house 1530, and an IC manufacturer/fabricator ("fab") 1550, that interact with one another in the design, development, and manufacturing cycles and/or services related to manufacturing an IC device 1560. The entities in IC manufacturing system 1500 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1520, mask house 1530, and IC fab 1550 is owned by a single larger company. In some embodiments, two or more of design house 1520, mask house 1530, and IC fab 1550 coexist in a common facility and use common resources.

Design house (or design team) 1520 generates an IC design layout diagram 1522. IC design layout diagram 1522 includes various geometrical patterns, for example, in FIGS. 5, 7-11, designed for an IC device 1560, for example, the memory devices with respect to FIGS. 1-2B, 5, 7-13. The geometrical patterns correspond to patterns of metal, oxide, or semiconductor layers that make up the various components of IC device 1560 to be fabricated. The various layers combine to form various IC features. For example, a portion of IC design layout diagram 1522 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1520 implements a proper design procedure to form IC design layout diagram 1522. The design procedure includes one or more of logic design, physical design or place and route. IC design layout diagram 1522 is presented in one or more data files having information of the geometrical patterns. For example, IC design layout diagram 1522 can be expressed in a GDSII file format or DFII file format.

Mask house 1530 includes data preparation 1532 and mask fabrication 1544. Mask house 1530 uses IC design layout diagram 1522 to manufacture one or more masks 1545 to be used for fabricating the various layers of IC device 1560 according to IC design layout diagram 1522. Mask house 1530 performs mask data preparation 1532, where IC design layout diagram 1522 is translated into a representative data file ("RDF"). Mask data preparation 1532 provides the RDF to mask fabrication 1544. Mask fabrication 1544 includes a mask writer. A mask writer converts the RDF to an image on a substrate, such as a mask (reticle) 1545 or a semiconductor wafer 1553. The IC design layout diagram 1522 is manipulated by mask data preparation 1532 to comply with particular characteristics of the mask writer and/or requirements of IC fab 1550. In FIG. 15, data preparation 1532 and mask fabrication 1544 are illustrated as separate elements. In some embodiments, data preparation 1532 and mask fabrication 1544 can be collectively referred to as mask data preparation.

In some embodiments, data preparation 1532 includes optical proximity correction (OPC) which uses lithography enhancement techniques to compensate for image errors, such as those that can arise from diffraction, interference, other process effects and the like. OPC adjusts IC design layout diagram 1522. In some embodiments, data preparation 1532 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1532 includes a mask rule checker (MRC) that checks the IC design layout diagram 1522 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1522 to compensate for limitations during mask fabrication 1544, which may undo part of the modifications performed by OPC in order to meet mask creation rules.

In some embodiments, data preparation 1532 includes lithography process checking (LPC) that simulates processing that will be implemented by IC fab 1550 to fabricate IC device 1560. LPC simulates this processing based on IC design layout diagram 1522 to create a simulated manufactured device, such as IC device 1560. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1522.

It should be understood that the above description of data preparation 1532 has been simplified for the purposes of clarity. In some embodiments, data preparation 1532 includes additional features such as a logic operation (LOP) to modify the IC design layout diagram 1522 according to manufacturing rules. Additionally, the processes applied to IC design layout diagram 1522 during data preparation 1532 may be executed in a variety of different orders.

After data preparation 1532 and during mask fabrication 1544, a mask 1545 or a group of masks 1545 are fabricated based on the modified IC design layout diagram 1522. In some embodiments, mask fabrication 1544 includes performing one or more lithographic exposures based on IC design layout diagram 1522. In some embodiments, an electron-beam (e-beam) or a mechanism of multiple e-beams is used to form a pattern on a mask (photomask or reticle) 1545 based on the modified IC design layout diagram 1522. Mask 1545 can be formed in various technologies. In some embodiments, mask 1545 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1545 includes a transparent substrate (for example, fused quartz) and an opaque material (for example, chromium) coated in the opaque regions of the binary mask. In another example, mask 1545 is formed using a phase shift technology. In a phase shift mask (PSM) version of mask 1545, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1544 is used in a variety of processes. For example, such a mask(s) is used in an ion implantation process to form various doped regions in semiconductor wafer 1553, in an etching process to form various etching regions in semiconductor wafer 1553, and/or in other suitable processes.

IC fab 1550 includes wafer fabrication 1552. IC fab 1550 is an IC fabrication business that includes one or more manufacturing facilities for the fabrication of a variety of different IC products. In some embodiments, IC Fab 1550 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1550 uses mask(s) 1545 fabricated by mask house 1530 to fabricate IC device 1560. Thus, IC fab 1550 at least indirectly uses IC design layout diagram 1522 to fabricate IC device 1560. In some embodiments, semiconductor wafer 1553 is fabricated by IC fab 1550 using mask(s) 1545 to form IC device 1560. In some embodiments, the IC fabrication includes performing one or more lithographic exposures based at least indirectly on IC design layout diagram 1522. Semiconductor wafer 1553 includes a silicon substrate or other proper substrate having material layers formed thereon. Semiconductor wafer 1553 further includes one or more of various doped regions, dielectric features, multilevel interconnects, and the like (formed at subsequent manufacturing steps).

As described above, the present disclosure provides a memory device for testing, including coupled bit lines and continued conductive segments between the bit lines for forming conductive loops. With the configurations of the present disclosure that also provides a test method for the memory device, multiple test patterns are implemented for reliability check of the memory devices. In some embodiments, the tested memory devices and the memory devices being shipped are manufactured in the same wafer. Accordingly, an improved test efficiency and simultaneous monitor of memory devices being shipped are provided.

In some embodiments, a method is disclosed, including following operations: activating a first word line to couple a first bit line with a second bit line to form a first conductive loop through a first transistor having a first terminal coupled to the first bit line and a second transistor having a first terminal coupled to the second bit line, wherein second terminals of the first and second transistors are coupled together; activating a second word line to couple a third bit line with a fourth bit line to form a second conductive loop, wherein the first and second word lines are disposed below the first to fourth bit lines; and identifying that the first conductive loop, the second conductive loop, or the combinations thereof is short-circuited or open-circuited.

In some embodiments, a method is disclosed, including following operations: forming a plurality of first source structures and a plurality of second source structures that extend in a first direction in a first layer; and forming a plurality of cut layers extending in a second direction different from the first direction to separate the plurality of first source structures in a plurality of rows extending in the second direction, wherein a first structure of the plurality of second source structures is electrically coupled between first and second bit lines in first and second rows of the plurality of rows.

In some embodiments, a device is disclosed. The device includes a plurality of first conductive segments extending in a first direction in a first layer, overlapping a plurality of bit lines in a layout view, and coupled to at least two bit lines in the plurality of bit lines that are in a second layer above the first layer; a plurality of second conductive segments each only overlapping a corresponding one of the plurality of bit lines and being separated from each other by a plurality of cut layers extending in a second direction; and a plurality of word lines extending in the first direction in a third layer below the first layer, wherein a first segment in the plurality of first conductive segments is shared by first and second transistors, configured to be turned on in response to a first word line signal in a first word line of the plurality of word lines, and is configured to transmit a signal between first and second lines in the plurality of bit lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    activating a first word line to couple a first bit line with a second bit line to form a first conductive loop through a first transistor having a first terminal coupled to the first bit line and a second transistor having a first terminal coupled to the second bit line, wherein second terminals of the first and second transistors are coupled together;
    activating a second word line to couple a third bit line with a fourth bit line to form a second conductive loop, wherein the first and second word lines are disposed below the first to fourth bit lines; and
    identifying that the first conductive loop, the second conductive loop, or the combinations thereof is short-circuited or open-circuited.

2. The method of claim 1, wherein the third bit line is coupled to a first terminal of a third transistor and the fourth bit line is coupled to a first terminal of a fourth transistor, wherein second terminals of the third and fourth transistors are coupled together.

3. The method of claim 2, wherein when the first and second word lines are activated, a fifth bit line is coupled to the second and third bit lines to couple the first and second conductive loops with each other.

4. The method of claim 1, wherein the first and second bit lines are disposed in a first memory region, and the third and fourth bit lines are disposed in a second memory region separated from the first memory region.

5. The method of claim 1, further comprising:
    coupling a first group of bit lines with each other to form a third conductive loop;
    coupling a second group of bit lines with each other to form a fourth conductive loop; and
    identifying that the first and third conductive loops are open or
    that the second and fourth conductive loops are open.

6. The method of claim 5, further comprising:
    identifying that the first and second conductive loops are short.

7. The method of claim 1, further comprising:
    activating a third word line to couple a fifth bit line with a sixth bit line to form a third conductive loop through a third transistor having a first terminal coupled to the third bit line and a fourth transistor having a first terminal coupled to the fourth bit line, wherein second terminals of the third and fourth transistors are coupled together;
    activating a fourth word line to couple a seventh bit line with an eighth bit line to form a fourth conductive loop through a fifth transistor having a first terminal coupled to the seventh bit line and a sixth transistor having a first terminal coupled to the eighth bit line, wherein second terminals of the fifth and sixth transistors are coupled together; and
    identifying that the third conductive loop, the fourth conductive loop, or the combinations thereof is short-circuited or open circuited.

8. The method of claim 1, further comprising:
    measuring a resistance of the first conductive loop, the second conductive loop, or the combinations thereof.

9. A method, comprising:
    forming a plurality of first source structures and a plurality of second source structures that extend in a first direction in a first layer,
    wherein the plurality of first source structures in a plurality of rows are separated from each other, wherein the plurality of rows extend in a second direction,
    wherein each of the plurality of second source structures extends along the first direction alongside at least two structures in the plurality of first source structures and a space, along the first direction, between the at least two structures in the plurality of first source structures,
    wherein a first structure of the plurality of second source structures is electrically coupled between first and second bit lines in first and second rows of the plurality of rows.

10. The method of claim 9, further comprising:
    forming a plurality of first drain structures passing across at least two rows of the plurality of rows, wherein a first structure of the plurality of first drain structures passes the second row and a third rows of the plurality of rows to couple the second bit line to a third bit line in the third row of the plurality of rows.

11. The method of claim 10, further comprising:
forming a plurality of second drain structures next to the first structure of the plurality of first drain structures, wherein the plurality of second drain structures are separated from each other.

12. The method of claim 9, further comprising:
forming a first drain structure extending from a third row to a fourth row in the plurality of rows to couple a third bit line in the third row to a fourth bit line in a fourth row, wherein the second row is interposed between the third and fourth rows.

13. The method of claim 9, further comprising:
forming a conductive line to couple a plurality of third bit lines that are coupled with the plurality of first source structures, wherein the conductive line extends in the first direction below the first layer, wherein one of the plurality of third bit lines is interposed between the first and second bit lines.

14. The method of claim 13, further comprising:
forming a sense amplifier in a second layer below the first layer to couple to one of the plurality of third bit lines.

15. The method of claim 9, further comprising:
forming a conductive layer, coupled to a ground potential, in a second layer above the first layer to couple with the plurality of first source structures.

16. The method of claim 9, wherein the plurality of first source structures, and the plurality of second source structures are formed between a plurality of dies on a wafer.

17. A memory device, comprising:
a plurality of first conductive segments extending in a first direction in a first layer, overlapping a plurality of bit lines in a layout view, and coupled to at least two bit lines in the plurality of bit lines that are in a second layer above the first layer;
a plurality of second conductive segments each only overlapping a corresponding one of the plurality of bit lines and being separated from each other by a plurality of cut layers extending in a second direction; and
a plurality of word lines extending in the first direction in a third layer below the first layer,
wherein a first segment in the plurality of first conductive segments is shared by first and second transistors, configured to be turned on in response to a first word line signal in a first word line of the plurality of word lines, and is configured to transmit a signal between first and second lines in the plurality of bit lines.

18. The memory device of claim 17, further comprising:
a conductive line extending in the first direction in a fourth layer below the second layer, and configured to couple third and fourth lines in the plurality of bit lines with each other.

19. The memory device of claim 17, wherein a second segment, different from the first segment, in the plurality of first conductive segments is shared by third and fourth transistors, configured to be turned on in response to a second word line signal in a second word line of the plurality of word lines, and is configured to transmit the signal between first and second lines in the plurality of bit lines.

20. The memory device of claim 19, wherein the first to fourth transistors are configured to be turned on at the same time.

* * * * *